United States Patent
D'Souza et al.

(10) Patent No.: US 7,977,984 B1
(45) Date of Patent: Jul. 12, 2011

(54) HIGH-SPEED CHARGE PUMP CIRCUITS

(75) Inventors: Lewelyn Mark D'Souza, Carrboro, NC (US); Weiqi Ding, Fremont, CA (US)

(73) Assignee: Altera Corporation, San Jose, CA (US)

( * ) Notice: Subject to any disclaimer, the term of this patent is extended or adjusted under 35 U.S.C. 154(b) by 55 days.

(21) Appl. No.: 11/871,994

(22) Filed: Oct. 13, 2007

(51) Int. Cl.
*H03L 7/06* (2006.01)

(52) U.S. Cl. .......... 327/157; 327/148; 327/536; 331/18; 331/25; 331/34; 375/373

(58) Field of Classification Search ............ 327/148, 327/157, 536; 331/18, 19, 25, 34; 375/373–376
See application file for complete search history.

(56) References Cited

U.S. PATENT DOCUMENTS

| | | | | |
|---|---|---|---|---|
| 5,821,799 A * | 10/1998 | Saripella | | 327/333 |
| 5,870,295 A | 2/1999 | Watanabe | | |
| 6,486,821 B1 * | 11/2002 | Aude et al. | | 341/172 |
| 6,914,476 B2 * | 7/2005 | Ingino, Jr. | | 327/540 |
| 6,956,771 B2 * | 10/2005 | Sarig et al. | | 365/185.18 |
| 7,157,949 B2 * | 1/2007 | Chen et al. | | 327/158 |
| 7,245,152 B2 * | 7/2007 | Wich | | 326/63 |
| 2004/0257162 A1 * | 12/2004 | Mokeddem | | 331/16 |
| 2005/0162200 A1 * | 7/2005 | Haerle | | 327/157 |
| 2005/0189973 A1 * | 9/2005 | Li | | 327/157 |
| 2006/0279332 A1 * | 12/2006 | Wich | | 326/80 |
| 2007/0176666 A1 * | 8/2007 | Arslan et al. | | 327/333 |
| 2008/0218277 A1 * | 9/2008 | Tan et al. | | 331/17 |
| 2008/0266916 A1 * | 10/2008 | Yen et al. | | 363/74 |
| 2009/0067478 A1 * | 3/2009 | Au et al. | | 375/219 |

* cited by examiner

*Primary Examiner* — Lincoln Donovan
*Assistant Examiner* — Shikha Goyal
(74) *Attorney, Agent, or Firm* — Steven J. Cahill

(57) ABSTRACT

A charge pump circuit includes at least one switching transistor and a level-shifter. The level-shifter has a cross-coupled pair of transistors. The level-shifter shifts a voltage of a first input signal to generate a level-shifted signal. The level-shifted signal controls a conductive state of the switching transistor to regulate an output voltage of the charge pump. A feedback loop circuit includes a detector and a charge pump. The detector compares an input signal to a feedback signal to generate first and second output signals. The charge pump includes at least two thin-oxide switching transistors and a level-shifter in another embodiment. The level-shifter shifts a voltage of the first output signal of the detector to generate a level-shifted signal. The two switching transistors are driven by the level-shifted signal and the second output signal of the detector to regulate an output voltage of the charge pump.

19 Claims, 6 Drawing Sheets

HIGH-SPEED CHARGE PUMP CIRCUITS

BACKGROUND OF THE INVENTION

The present invention relates to electronic circuit, and more particularly, to charge pump circuits.

A clock and data recovery (CDR) circuit is used in some communications systems, such as high-speed backplane, chip-to-chip, and line-side systems. A periodic clock signal is embedded in a data stream on the transmitting end of the system. A CDR circuit recovers the periodic clock signal from the data stream on the receiving end of the system. CDR functionality allows for higher transmission speeds, ensures that the data and clock signals are in phase, and relieves board trace routing restrictions.

The Stratix® II GX field programmable gate array manufactured by Altera Corporation of San Jose, Calif. has a CDR circuit. The Stratix II GX CDR circuit includes a bang-bang phase detector circuit, a charge pump circuit, a loop filter circuit, and a voltage-controlled oscillator (VCO) circuit that are coupled into a loop.

The input latch of the bang-bang phase detector (BBPD) is implemented using thin-oxide transistors that receive a supply voltage of 1.2 volts. The charge pump and the VCO receive a 3-volt supply voltage to obtain a large control voltage range for the VCO. Thick-oxide transistors in the charge pump and VCO blocks function with a 3-volt supply voltage. The charge pump has a level-shifter that converts 1.2-volt UP and DN control signals generated by the phase detector to 3-volt signals.

BRIEF SUMMARY OF THE INVENTION

According to some embodiments of the present invention, a charge pump circuit includes a switching transistor and a level-shifter. The level-shifter has a cross-coupled pair of transistors. The level-shifter shifts a voltage of a first input signal to generate a level-shifted signal. The level-shifted signal controls a conductive state of the switching transistor to regulate an output voltage of the charge pump.

According to other embodiments of the present invention, a feedback loop circuit includes a detector and a charge pump. The detector compares an input signal to a feedback signal to generate first and second output signals. The charge pump includes at least two switching transistors and a level-shifter. The level-shifter shifts a voltage of the first output signal of the detector to generate a level-shifted signal. The two switching transistors in the charge pump are thin-oxide transistors. The two switching transistors are driven by the level-shifted signal and the second output signal of the detector to regulate an output voltage of the charge pump. In another embodiment, the level-shifter also has thin-oxide transistors.

Various objects, features, and advantages of the present invention will become apparent upon consideration of the following detailed description and the accompanying drawings.

DETAILED DESCRIPTION OF THE INVENTION

The Stratix II GX CDR circuit functions well for data rates below the operating limits of the thick-oxide transistors in the charge pump (e.g., 5 Gigabits per second). However, high data rate input signals (e.g., 10 Gigabits per second) cause a speed bottleneck in the level-shifter in the charge pump. The level-shifter reduces the pulse widths of the UP and DN signals, which reduce the output current of the charge pump.

The thick-oxide transistors used to construct switches in the Stratix II GX charge pump also cause incomplete settling of the charge pump current. As a result, an incorrect amount of charge is deposited on the loop filter capacitor. Poor level-shifter performance and slow charge pump settling show up as errors in the control voltage on the loop filter capacitor, which can reduce the tolerance of the CDR circuit to jitter in the input data signal.

Figure 1:
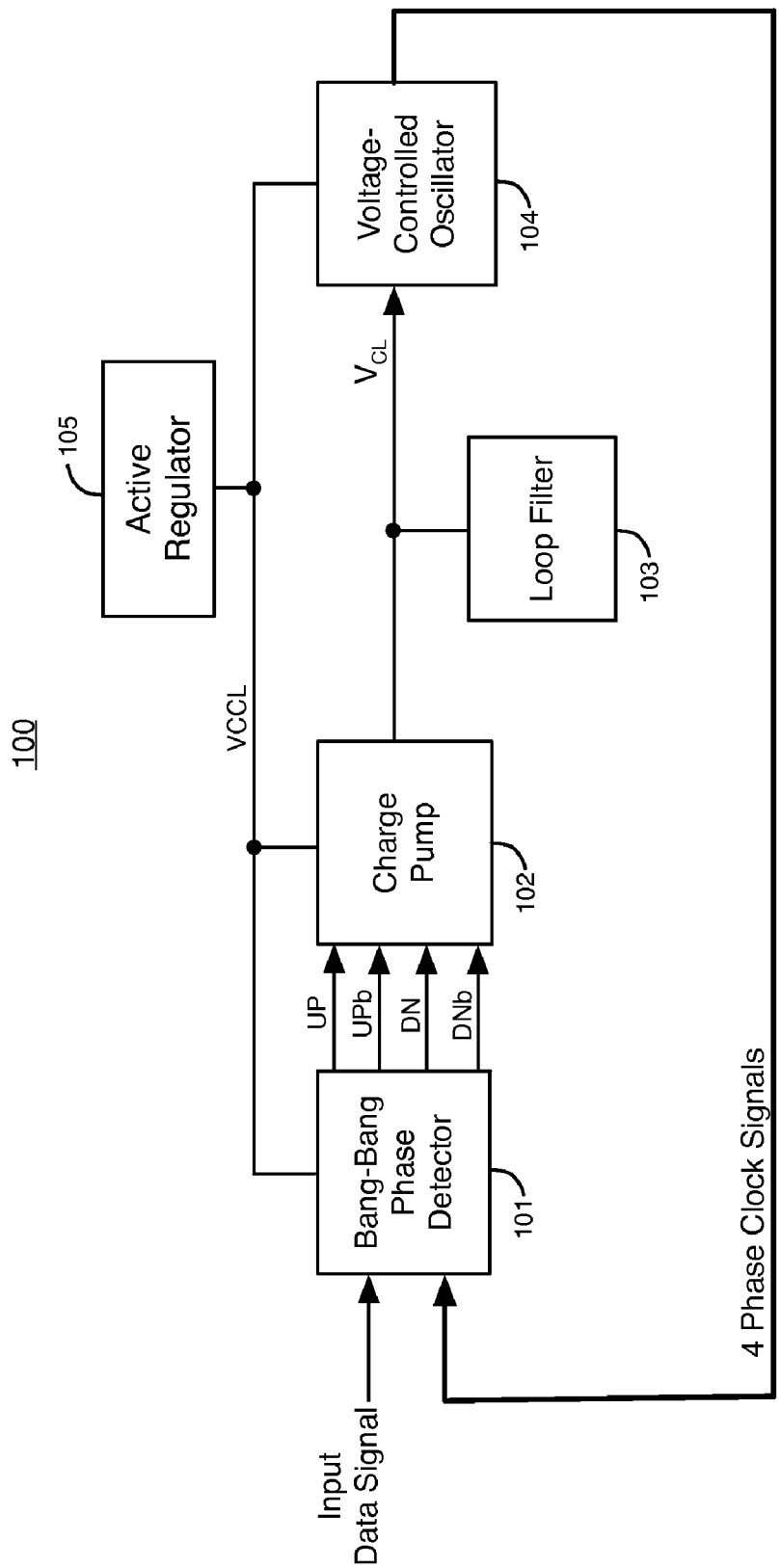
FIG. 1 illustrates a clock and data recovery (CDR) circuit, according to an embodiment of the present invention

FIG. 1 illustrates a clock and data recovery (CDR) circuit 100, according to an embodiment of the present invention. CDR circuit 100 is merely one example of a circuit that can include embodiments of the present invention. It should be understood that embodiments of the present invention can be used in CDR circuits having numerous other configurations. CDR circuit 100 is typically fabricated on an integrated circuit, such as a field programmable gate array or an application specific integrated circuit.

CDR 100 generates a set of periodic clock signals having phases that are set based on the phase of an input data signal. CDR 100 is a feedback loop circuit that includes a bang-bang phase detector circuit 101, a charge pump circuit 102, a loop filter circuit 103, a voltage-controlled oscillator (VCO) circuit 104, and an active regulator circuit 105.

Bang-bang phase detector (BBPD) 101 receives an input data signal. The input data signal contains a stream of digital data bits and is typically not a periodic signal. BBPD 101 is a binary phase detector circuit. BBPD 101 compares the phase of the input data signal to the phases of four different periodic clock signals generated by VCO 104. BBPD 101 generates UP, UPb, DN, and DNb digital error signals that are indicative of the differences between the phase of the input data signal and the phases of the four clock signals generated by VCO 104. The UPb signal is the inverse of the UP signal, and the DNb signal is the inverse of the DN signal. Thus, UP and UPb are complementary signals, and DN and DNb are complementary signals.

The input data signal typically contains some phase jitter. BBPD 101 adjusts the pulse widths of the UP and UPb signals or the pulse widths of the DN and DNb signals in response to changes in the phase differences between the input data signal and the four clock signals generated by VCO 104.

The UP, UPb, DN, and DNb error signals are transmitted to charge pump 102. Charge pump 102 converts the UP, UPb, DN, and DNb error signals into a control voltage $V_{CL}$ that is transmitted to voltage-controlled oscillator (VCO) 104. Loop filter 103 is a low pass filter that attenuates high frequency components of the control voltage $V_{CL}$. Loop filter 103 typically contains a capacitor.

VCO 104 generates four output clock signals that are transmitted to inputs of phase detector 101. The four output clock signals have four different phases (e.g., 0°, 90°, 180°, 270°). VCO 104 adjusts the phases of its four output clock signals in response to changes in the control voltage $V_{CL}$. According to alternative embodiments, CDR 100 can have a current-controlled oscillator or another type of oscillator, instead of VCO 104.

The frequency of the four output clock signals generated by VCO 104 is selected based on the data rate of the input data signal. Before CDR circuit 100 begins to operate, a phase-locked loop (not shown) can be used to adjust the frequency of the VCO output clock signals to match the data rate of the input data signal. After VCO 104 has locked onto the input data rate, the phase-locked loop is disconnected from VCO 104, and the four output clock signals of VCO 104 are maintained at a constant frequency. The frequency of the four clock signals can be, for example, one-half the data rate of the input data signal (i.e., a half-rate CDR circuit).

VCO 104 includes delay cell circuits that are coupled together to form a ring oscillator. Thin-oxide transistors are used in the delay cell circuits. The thin-oxide transistors are metal oxide semiconductor field-effect transistors, i.e., MOSFETs. The thin-oxide transistors receive a reduced supply voltage VCCL (e.g., 1.2 volts) from active regulator circuit 105. The thin-oxide transistors in CDR circuit 100 operate at a higher speed than the thick-oxide transistors. The thin-oxide transistors are high-speed transistors, because they can turn on and off in less time than thick-oxide transistors that receive a greater supply voltage.

BBPD 101 includes high-speed thin-oxide MOSFETs that receive a reduced supply voltage VCCL (e.g., 1.2 volts) from regulator 105. Charge pump 102 also includes high-speed thin-oxide MOSFETs that receive a reduced supply voltage VCCL (e.g., 1.2 volts) from regulator 105. CDR circuit 100 can operate at a faster data rate (e.g., 10 Gigabits per second (Gbps)), because BBPD 101, charge pump 102, and VCO 104 all contain high-speed thin-oxide transistors.

Figure 2:
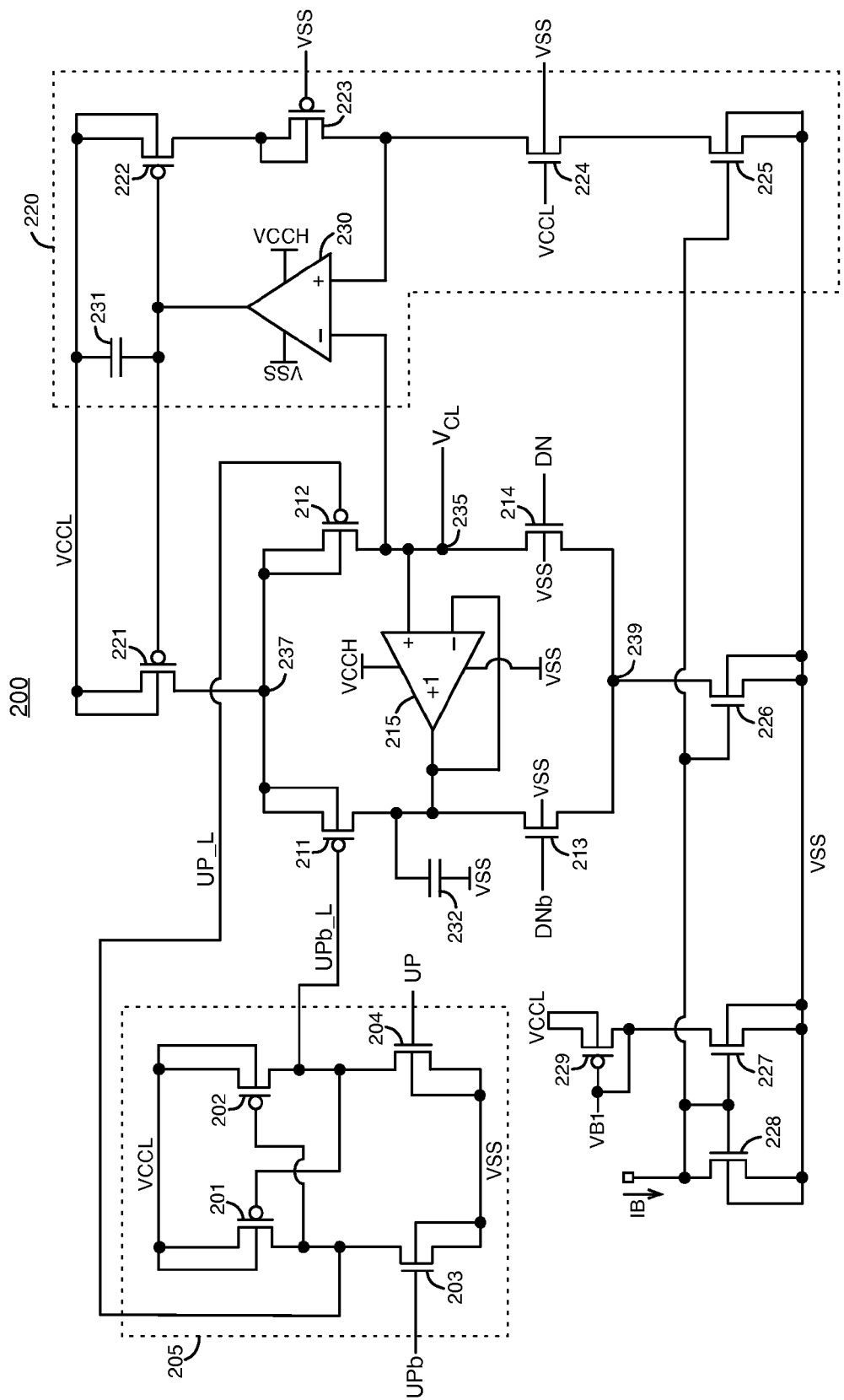
FIG. 2 illustrates an example of a high-speed charge pump circuit, according to an embodiment of the present invention.

An example of a charge pump circuit with thin-oxide transistors that can be used in a 10 Gbps CDR circuit 100 is shown in FIG. 2. FIG. 2 illustrates an example of a high-speed charge pump circuit 200, according to an embodiment of the present invention. Charge pump 200 is an example of charge pump circuit 102 in clock and data recovery (CDR) circuit 100.

Charge pump 200 includes p-channel metal oxide semiconductor field-effect transistors (MOSFETs) 201-202, 211-212, 221-223, and 229. Charge pump 200 also includes n-channel MOSFETs 203-204, 213-214, and 224-228. Charge pump 200 also includes unity gain amplifier 215, amplifier 230, and capacitors 231-232. Transistors 211-214 are switching transistors.

Transistors 201-204, 211-214, and 221-229 are thin-oxide transistors that are driven by a reduced supply voltage VCCL-VSS (e.g., 1.2 volts). The transistors in amplifiers 215 and 230 are thick-oxide transistors that are driven by a larger supply voltage VCCH-VSS (e.g., 3 volts) so that the amplifiers can function over the control voltage $V_{CL}$ range (e.g., 0.25-0.8 volts). The thin-oxide transistors 201-204, 211-214, and 221-229 have smaller threshold voltages, smaller breakdown voltages, and faster switching times than the thick-oxide transistors.

An example of an oxide thickness for the thin-oxide MOSFETs in charge pump 200 is 17 angstroms. Using other examples, the thin-oxide MOSFETs in charge pump 200 can have oxide thicknesses in the range of 10-20 angstroms or 10-30 angstroms. An example of an oxide thickness for the thick-oxide MOSFETs in amplifiers 215 and 230 is 55 angstroms.

BBPD 101 in CDR circuit 100 is configured to generate UP, UPb, DN, and DNb output signals in response to an input data signal that has a small voltage swing. For example, BBPD 101 can generate UP, UPb, DN, and DNb output signals in response to an input data signal that has a voltage range of 0.8-1.2 volts (i.e., a voltage swing of 400 millivolts (mV)). A current mode logic (CML) transmitter circuit can, e.g., generate an input data signal that varies between 0.8 and 1.2 volts.

Figure 3A:
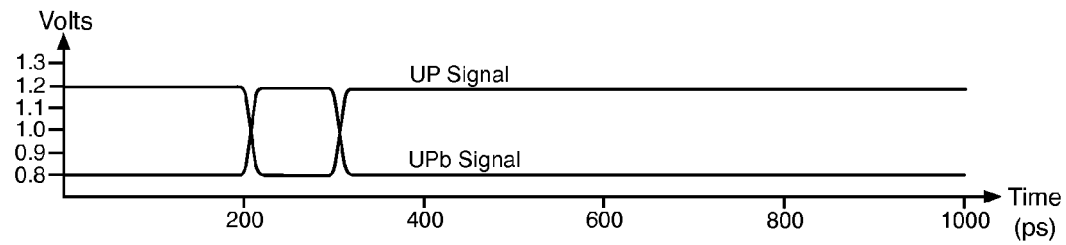
FIG. 3A illustrates examples of UP and UPb signals generated by a bang-bang phase detector (BBPD) in response to a current mode logic (CML) transmitter.
Figure 3B:
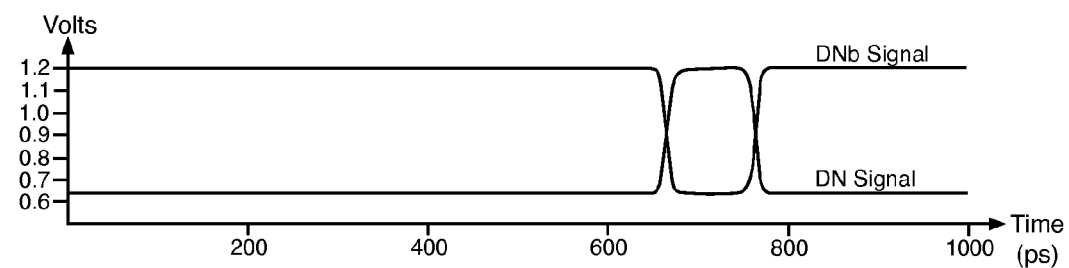
FIG. 3B illustrates example of DN and DNb signal generated by a BBPD in response to a CML transmitter.

As discussed above, BBPD 101 has thin-oxide transistors that are driven by a reduced supply voltage VCCL, e.g., 1.2 volts or less than 1.8 volts. The voltage swing of the signals UP, UPb, DN, and DNb is approximately the same as the voltage swing of the input data signal. For example, the UP and UPb signals can vary between 0.8 and 1.2 volts, as shown in FIG. 3A, and the DN and DNb signals can vary between 0.65 and 1.2 volts, as shown in FIG. 3B. FIGS. 3A-3B illustrate examples of the UP, UPb, DN, and DNb signals generated by BBDP 101 in response to a CML transmitter that generates an input data signal varying between 0.8 and 1.2 volts.

A voltage range of 0.8-1.2 volts does not turn p-channel transistors 211-212 on and off. Therefore, level-shifter circuit 205 is added to charge pump 200 to shift the voltage of signals UP and UPb to a voltage range that turns transistors 211-212 on and off. Level-shifter circuit 205 increases the voltage swing of signals UP and UPb, and decreases the common mode voltage of signals UP and UPb. The voltage swing of a signal refers to the difference between the maximum and minimum voltages of the signal.

Level-shifter 205 includes transistors 201-204. P-channel transistors 201-202 are cross-coupled transistors. The gate of transistor 201 is coupled to the drain of transistor 202, and the gate of transistor 202 is coupled to the drain of transistor 201. The sources of transistors 201-202 are coupled to supply voltage VCCL, and the sources of transistors 203-204 are coupled to supply voltage VSS. The drains of transistors 201 and 202 are coupled to the drains of transistors 203 and 204, respectively.

Signals UP and UPb are the input voltages of level-shifter 205. Level-shifter 205 level shifts the voltages of the UP and UPb signals to generate level-shifted UP_L and UPb_L signals that turn switching transistors 212 and 211 on and off. Cross-coupled p-channel transistors 201-202 generate positive feedback that provides high gain to level-shifter 205. The high gain provided by transistors 201-202 causes the voltages of signals UP_L and UPb_L to have sharp rising edges during low-to-high transitions and sharp falling edges during high-to-low transitions.

The operation of level-shifter 205 is now described. Assume that UP and UP_L are initially high, and UPb and UPb_L are initially low. After UP transitions to a logic low, and UPb transitions to a logic high, transistor 203 turns on, and transistor 204 turns off. Transistor 203 reduces the gate voltage UP_L of transistor 202. Then, transistor 202 turns on and increases the voltage of signal UPb_L, which turns transistor 201 off. After transistor 201 turns off, transistor 203 pulls the UP_L voltage down to VSS.

After UP transitions to a logic high, and UPb transitions to a logic low, transistor 203 turns off, and transistor 204 turns on. Transistor 204 reduces the gate voltage UPb_L of transistor 201. Then, transistor 201 turns on and increases the voltage of signal UP_L, which turns transistor 202 off. After transistor 202 turns off, transistor 204 pulls the UPb_L voltage down to VSS.

Figure 3C:
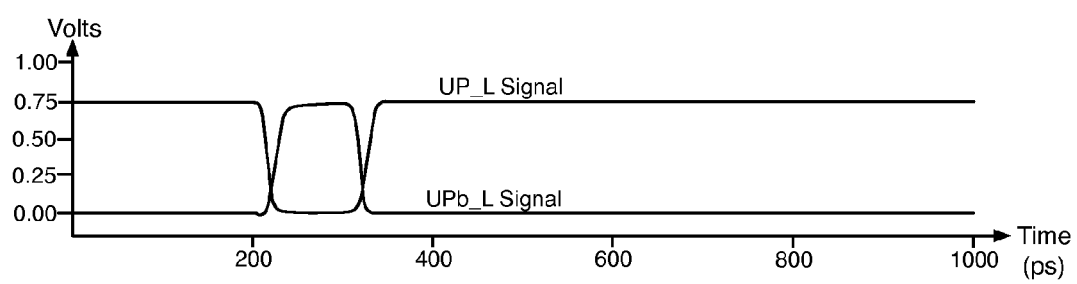
FIG. 3C illustrates examples of level shifted UP and UPb signals that are generated by a level-shifter circuit, according to an embodiment of the present invention.

Cross-coupled transistors 201-202 increase the voltage swing of the UP_L and UPb_L voltages relative to the voltage swing of the UP and UPb voltages. Cross-coupled transistors 201-202 also shift the common mode voltage of signals UP and UPb to a smaller voltage. As a result, level-shifter circuit 205 can turn switching transistors 211 and 212 on and off in response to UP and UPb voltages that cannot be used to directly switch transistors 211 and 212 on and off. For example, level-shifter circuit 205 can shift the voltages of the UP and UPb signals from a voltage range of 0.8 volts to 1.2 volts, as shown in FIG. 3A, to generate UP_L and UPb_L signals that have a voltage range of 0.00 volts to 0.75 volts, as shown in FIG. 3C. FIG. 3C illustrates examples of the UP_L and UPb_L signals generated by level-shifter 205 in response to the UP and UPb signals shown in FIG. 3A.

Transistor 221 represents multiple p-channel current source MOSFETs that are coupled in parallel between VCCL and node 237. Transistor 226 represents multiple re-channel current source MOSFETs that are coupled in parallel between node 239 and VSS. P-channel current source transistors 221 provide a tail current from supply voltage VCCL to switching transistors 211-214. N-channel current source transistors 226 provide a sink current from switching transistors 211-214 to the lower supply voltage VSS (e.g., ground). The number of MOSFETs 221 and 226 that are turned on can be varied using programmable control signals to adjust the current through switching transistors 211-214.

Figure 4:
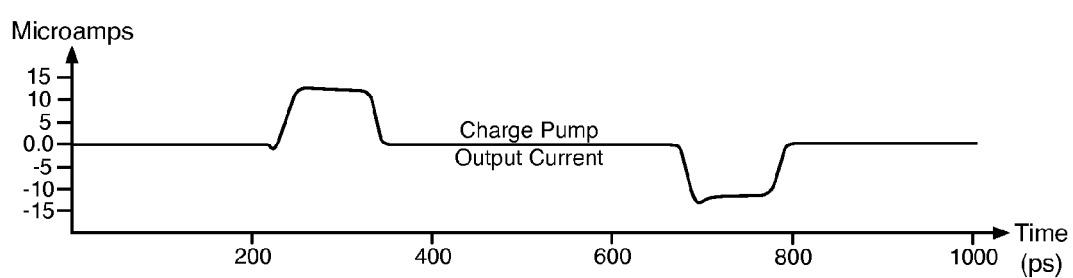
FIG. 4 illustrates an example of the output current that the charge pump shown in FIG. 2 generates in response to the signals shown in FIGS. 3B and 3C, according to an embodiment of the present invention.

FIG. 4 illustrates an example of the output current that charge pump 200 generates at node 235 in response to the signals shown in FIGS. 3B and 3C. Switching transistors 211-214 have the advantage of contributing fewer phase errors in the VCO clock signals that are caused by charge injection. Transistors 211-214 also provide an output current settling performance that is closer to a current steering cell than a switch.

Because switching transistors 211-214 are thin-oxide transistors, switching transistors 211-214 act like a differential pair for part of the transition, which makes charge settling at the output 235 of charge pump 200 faster, more linear, and have fewer glitches. As a result, the output current of charge pump 200 settles more completely in response to pulses in the UP_L and DN signals, as shown in FIG. 4. Also, CDR circuit 100 can more accurately match the phase of the VCO output clock signals to the phase of the input data signal at higher input data rates. Charge pump 200 provides these benefits even though pulses in the UP, UPb, DN, and DNb signals from phase detector 101 are not full rail-to-rail signals.

Signals UPb_L and UP_L control the conductive states of switching transistors 211 and 212, respectively. Signals DN and DNb control the conductive states of switching transistors 214 and 213, respectively.

If the crossover point between logic transitions in signals UP_L and UPb_L were halfway between the highest and lowest voltages of UP_L and UPb_L, transistors 211 and 212 would turn off concurrently for a brief period. While transistors 211 and 212 were both off, charge would build up at node 237, which can cause transistors 221 to conduct less current or possibly turn off.

However, level-shifter 205 prevents both of transistors 211 and 212 from being off concurrently during a logic state transition in signals UP_L and UPb_L. When the UP and UPb signals change logic states, level-shifter 205 generates a finite time period during which the UP_L signal and the UPb_L signal are both logic lows. As a result, the crossover point between the voltages of the UP_L and UPb_L signals during logic state transitions is not halfway between the highest and lowest voltages of UP_L and UPb_L. Instead, the crossover point between voltages of the UP_L and UPb_L signals during logic state transitions is closer to zero volts, as shown, e.g., in FIG. 3C, because the UP_L low pulse is wider than the UPb_L high pulse.

The positive feedback generated by cross-coupled transistors 201-202 causes hysteresis during the logic state transitions of output voltages UP_L and UPb_L. The hysteresis causes level-shifter 205 to have different threshold levels depending on which direction the input voltages UP and UPb are moving. Enough charge has to build up at the gate of the transistor 201 or 202 that is off to turn that transistor on before a rising edge can begin in one of the output voltages UP_L or UPb_L. The output voltage of level-shifter 205 (UP_L or UPb_L) that is a logic high decreases to a logic low before the other output voltage transitions to a logic high.

The hysteresis in level-shifter 205 causes both of transistors 211 and 212 to be on concurrently for a brief period of time during the logic state transitions of signals UP_L and UPb_L, which ensures that the tail current through transistors 221 is never turned off. This feature of level shifter 205 improves the charge settling performance of charge pump 200 by reducing glitches in the output current of charge pump 200 through transistors 212 and 214.

As mentioned above, a level-shifter with thick-oxide transistors that receives a 3-volt supply voltage significantly reduces the pulse width of the UP signal and the output current of the charge pump, especially in integrated circuit (IC) die that are fabricated with a slow process. On the other hand, the pulse widths of the UP_L and UPb_L signals generated by level-shifter 205 are nearly constant over a range of process variations at higher data rates, such as 10 Gbps, or equivalently, when the CDR circuit generates narrow UP, UPb, DN, and DNb pulses.

Because UPb_L is the inverse of UP_L, transistors 211 and 212 are switched out of phase with each other. In other words, transistor 211 is on when transistor 212 is off, and transistor 212 is on when transistor 211 is off. Because DNb is the inverse of DN, transistors 213 and 214 are also switched out of phase with each other.

The UP_L and DN signals control the conductive states of switching transistors 212 and 214, respectively, to regulate the charge stored in loop filter 103 (i.e., the control voltage $V_{CL}$). The UP_L and DN signals cause transistor 212 to be on for a longer period of time than transistor 214 to increase the control voltage $V_{CL}$. The UP_L and DN signals cause transistor 214 to be on for a longer period of time than transistor 212 to decrease the control voltage $V_{CL}$. Switching transistors 211 and 213 are on when switching transistors 212 and 214 are off, respectively, to reduce fluctuations in the voltage at node 237.

The non-inverting (+) input of unity gain amplifier 215 is coupled to the drains of each of transistors 212 and 214 and to the output node 235 of charge pump 200. The inverting input (−) and the output of unity gain amplifier 215 are coupled to the drains of each of transistors 211 and 213 at capacitor 232.

Unity gain amplifier 215 attempts to maintain the voltage on capacitor 232 substantially equal to $V_{CL}$ to reduce fluctuations in the voltage on capacitor 232. Amplifier 215 also reduces fluctuations in the voltage at node 237, which reduces charge sharing from output node 235 to node 237 when transistor 212 turns on. Capacitor 232 is a compensation capacitor that stabilizes the feedback loop around amplifier 215.

Charge pump 200 also has a replica bias circuit 220 for current matching. Replica bias circuit 220 includes amplifier 230, capacitor 231, p-channel MOSFETs 222-223, and n-channel MOSFETs 224-225. Replica bias circuit 220 reduces mismatches between the total current through transistors 221 and the total current through transistors 226.

N-channel transistors 225-228 are a current mirror circuit. The current IB through transistor 228 is the reference current for the current mirror. Reference current IB is mirrored through transistor 227, transistors 226, and transistor 225, according to the relative width-to-length channel ratios of transistor 225-228. Transistor 229 is biased by voltage VB1 and coupled to VCCL.

The non-inverting input (+) of amplifier 230 is coupled to the drains of transistors 223 and 224. The inverting input (−) of amplifier 230 is coupled to the output node 235 of charge pump 200. The gate of p-channel transistor 223 is coupled to VSS, and the gate of n-channel transistor 224 is coupled to VCCL. Therefore, transistors 223-224 are maintained on.

The width-to-length (W/L) channel ratio of transistor 222 equals the W/L channel ratio of each of transistors 221. The W/L channel ratio of transistor 223 equals the W/L channel ratio of transistor 212. The W/L channel ratio of transistor 224 equals the W/L channel ratio of transistor 214. The W/L channel ratio of transistor 225 equals the W/L channel ratio of each of transistors 226.

The output of amplifier 230 is coupled to the gates of p-channel transistors 221 and 222 and to capacitor 231. Amplifier 230 controls the currents through transistors 221 and transistor 222 to cause the voltage at its non-inverting input and the control voltage $V_{CL}$ at its inverting input to be approximately equal to each other. When the voltage at the non-inverting input of amplifier 230 equals $V_{CL}$, the total current through transistors 221 equals the total current through transistors 226. As a result, amplifier 230 reduces mismatches between the total current through transistors 221 and the total current through transistors 226.

Because charge pump circuit 200 has thin-oxide MOSFETs 201-204, 211-214, and 221-229, CDR circuit 100 can operate at higher speeds, e.g., 10 Gigabits per second (Gbps). BBPD 101 and charge pump 200 can function properly in response to CML input data signals, and BBPD 101 does not need full swing latches. The high-speed performance of CDR circuit 100 is also achieved by preventing the tail current through transistors 221 from turning off during a switching transition, as discussed above. Replica bias circuit 220 ensures current matching, even though the current mirror circuit does not have a cascode transistor, as a result of the insufficient headroom provided by a 1.2-volt supply voltage.

Charge pump 200 generates less deterministic phase jitter in the four output clock signals of VCO 104. As a result, CDR circuit 100 has a greater tolerance for phase jitter in the input data signal. It is desirable to increase the tolerance for jitter in the input data signal, because CDR circuit 100 is designed to generate VCO output clock signals that track variations in the phase of the input data signal. Thus, CDR circuit 100 has a greater margin for tracking phase jitter in the input data signal.

According to an alternative embodiment of the present invention, a level-shifter can be used in charge pump 200 to adjust the voltage swing and the common mode voltage of the DN and DNb signals before they are used to drive transistors 213 and 214. This embodiment may be useful, for example, when the common mode voltage of the input data signal is too small to switch transistors 213 and 214 on and off.

Figure 5:
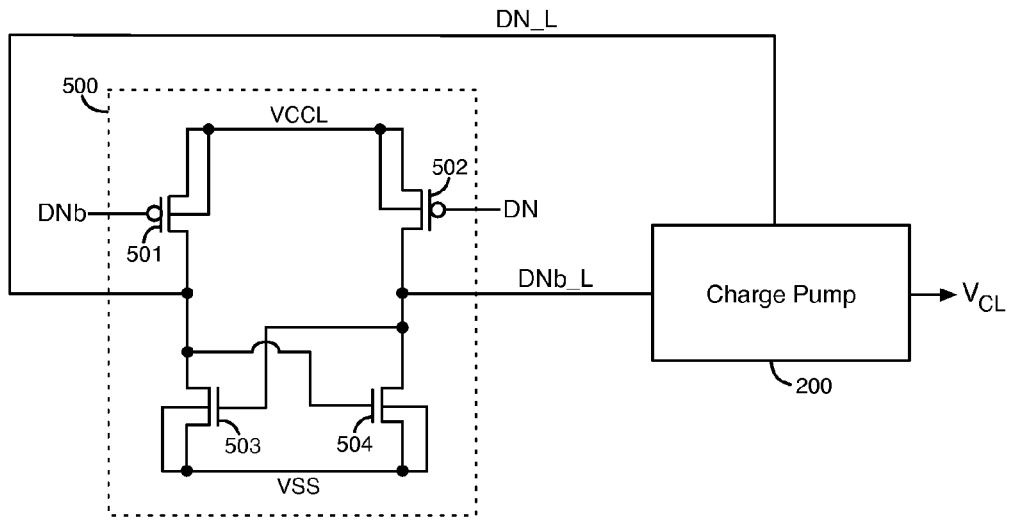
FIG. 5 illustrates an example of a level-shifter circuit that adjusts the voltage swing and the common mode voltage of DN and DNb signals, according to another embodiment of the present invention.

FIG. 5 illustrates an example of a level-shifter circuit 500 that adjusts the voltage swing and the common mode voltage of the DN and DNb signals, according to another embodiment of the present invention. Level-shifter circuit 500 includes p-channel MOSFETs 501-502 and cross-coupled n-channel MOSFETs 503-504. Transistors 501-504 are thin-oxide transistors that are coupled across a reduced supply voltage VCCL-VSS (e.g., 1.2 volts).

The DNb signal is transmitted to the gate of transistor 501, and the DN signal is transmitted to the gate of transistor 502. A level shifted DN signal (referred to as DN_L) is generated at the drains of transistors 501 and 503. A level shifted DNb signal (referred to as DNb_L) is generated at the drains of transistors 502 and 504. The DN_L and DNb_L signals are transmitted to charge pump 200 to drive the gates of transistors 214 and 213, respectively. In the embodiment of FIG. 5, charge pump 200 may or may not have level-shifter 205.

Level-shifter circuit 500 has positive feedback that causes hysteresis during logic state transitions in the DN and DNb signals. The hysteresis causes both of transistors 213 and 214 to be on concurrently for a brief period of time during logic state transitions in DN_L and DNb_L. The positive feedback also generates a high gain in level-shifter 500 that causes sharp rising and falling edges in DN_L and DNb_L during logic state transitions in DN_L and DNb_L.

According to another embodiment, charge pump 200 shown in FIG. 2 can be used in a phase-locked loop (PLL) circuit. According to yet another embodiment, charge pump circuit 200 can be used in a delay-locked loop (DLL) circuit.

Figure 6:
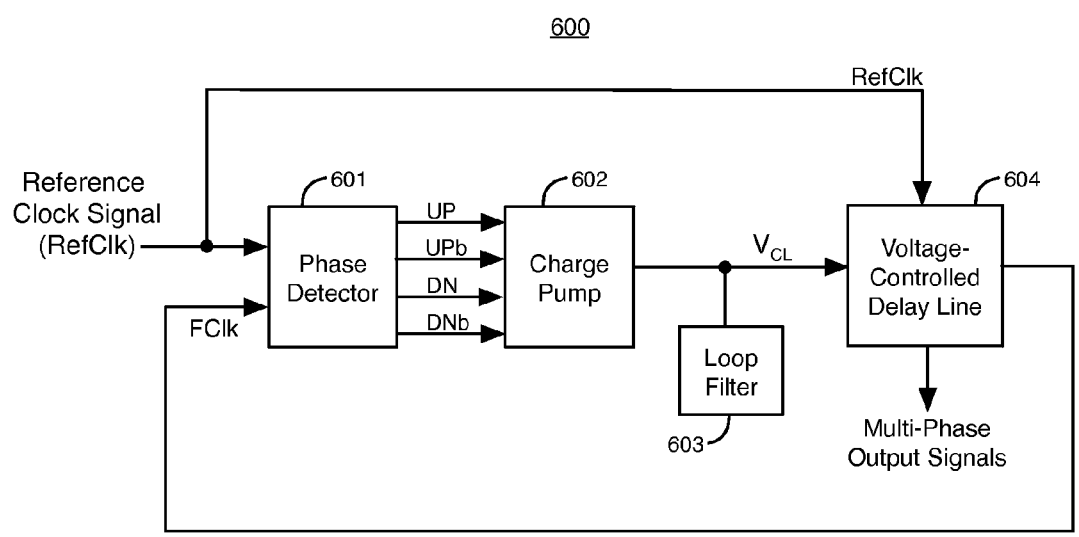
FIG. 6 illustrates an example of a delay-locked loop (DLL), according to an embodiment of the present invention.

FIG. 6 illustrates an example of a delay-locked loop (DLL) 600, according to an embodiment of the present invention. DLL 600 is one example of a DLL that can include embodiments of the present invention. It should be understood that embodiments of the present invention can be used with DLLs having numerous other configurations.

Delay-locked loop (DLL) 600 is a feedback loop circuit that includes a phase detector circuit 601, a charge pump circuit 602, a loop filter 603, and a voltage-controlled delay line (VCDL) circuit 604. Phase detector 601 compares a reference periodic clock signal RefClk to a feedback periodic clock signal FClk that has the same frequency. Because the frequencies of RefClk and FClk are the same, phase detector 601 compares the phases of these two signals.

Phase detector 601 generates UP, DN, UPb, and DNb error signals that are indicative of the difference between the phases of RefClk and FClk. The UP, UPb, DN, and DNb error signals are transmitted to charge pump 602. Charge pump 602 converts the UP, UPb, DN, and DNb error signals into a control voltage $V_{CL}$. According to an embodiment of the present invention, charge pump circuit 200 shown in FIG. 2 is used as charge pump circuit 602 in DLL 600. According to another embodiment, level-shifter 500 and charge pump 200 are used in charge pump 602.

Loop filter 603 is coupled to the output node of charge pump 602. Loop filter 603 contains a capacitor that filters high frequency signals in the control voltage $V_{CL}$.

Voltage-controlled delay line (VCDL) 604 includes a set of delay circuits. The delay circuits delay the reference clock signal RefClk to generate the feedback clock signal FClk. VCDL 604 sets the delay of the delay circuits in response to the control voltage $V_{CL}$. DLL 600 adjusts the phase of FClk in response to changes in control voltage $V_{CL}$ until the phase of FClk matches the phase of RefClk. VCDL 604 also generates a set of output signals that have multiple phases.

Figure 7:
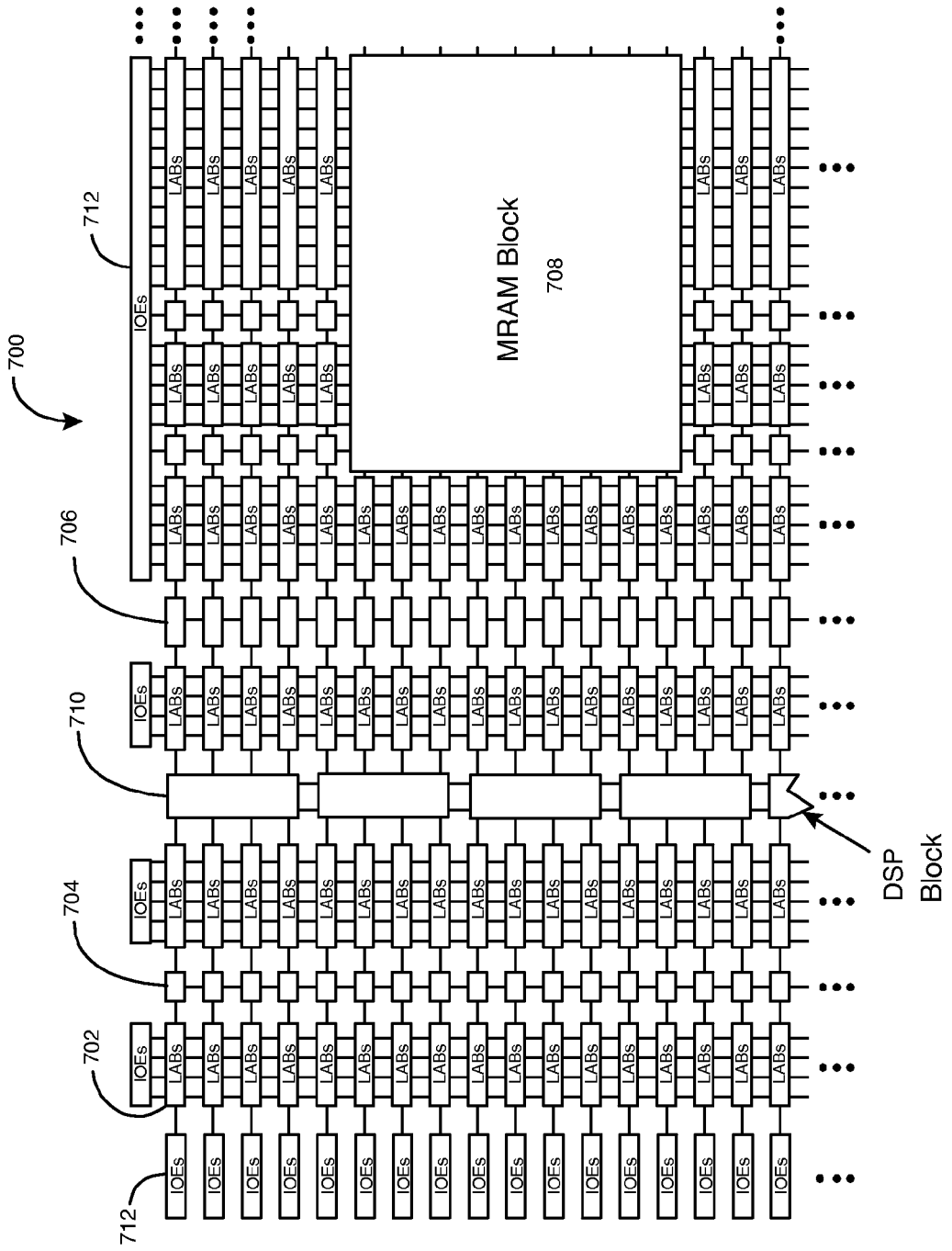
FIG. 7 is a simplified partial block diagram of a field programmable gate array (FPGA) that can include aspects of the present invention.

FIG. 7 is a simplified partial block diagram of a field programmable gate array (FPGA) 700 that can include aspects of the present invention. FPGA 700 is merely one example of an integrated circuit that can include features of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), and application specific integrated circuits (ASICs).

FPGA 700 includes a two-dimensional array of programmable logic array blocks (or LABs) 702 that are interconnected by a network of column and row interconnect conductors of varying length and speed. LABs 702 include multiple (e.g., 10) logic elements (or LEs).

An LE is a programmable logic block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 700 also includes a distributed memory structure including random access memory (RAM) blocks of varying sizes provided throughout the array. The RAM blocks include, for example, blocks 704, blocks 706, and block 708. These memory blocks can also include shift registers and FIFO buffers.

FPGA 700 further includes digital signal processing (DSP) blocks 710 that can implement, for example, multipliers with add or subtract features. Input/output elements (IOEs) 712 located, in this example, around the periphery of the chip support numerous single-ended and differential input/output standards. IOEs 712 are coupled to IO pins. Each IO pin is coupled to an external terminal of the FPGA. It is to be understood that FPGA 700 is described herein for illustrative purposes only and that the present invention can be implemented in many different types of PLDs, FPGAs, and ASICs.

Figure 8:
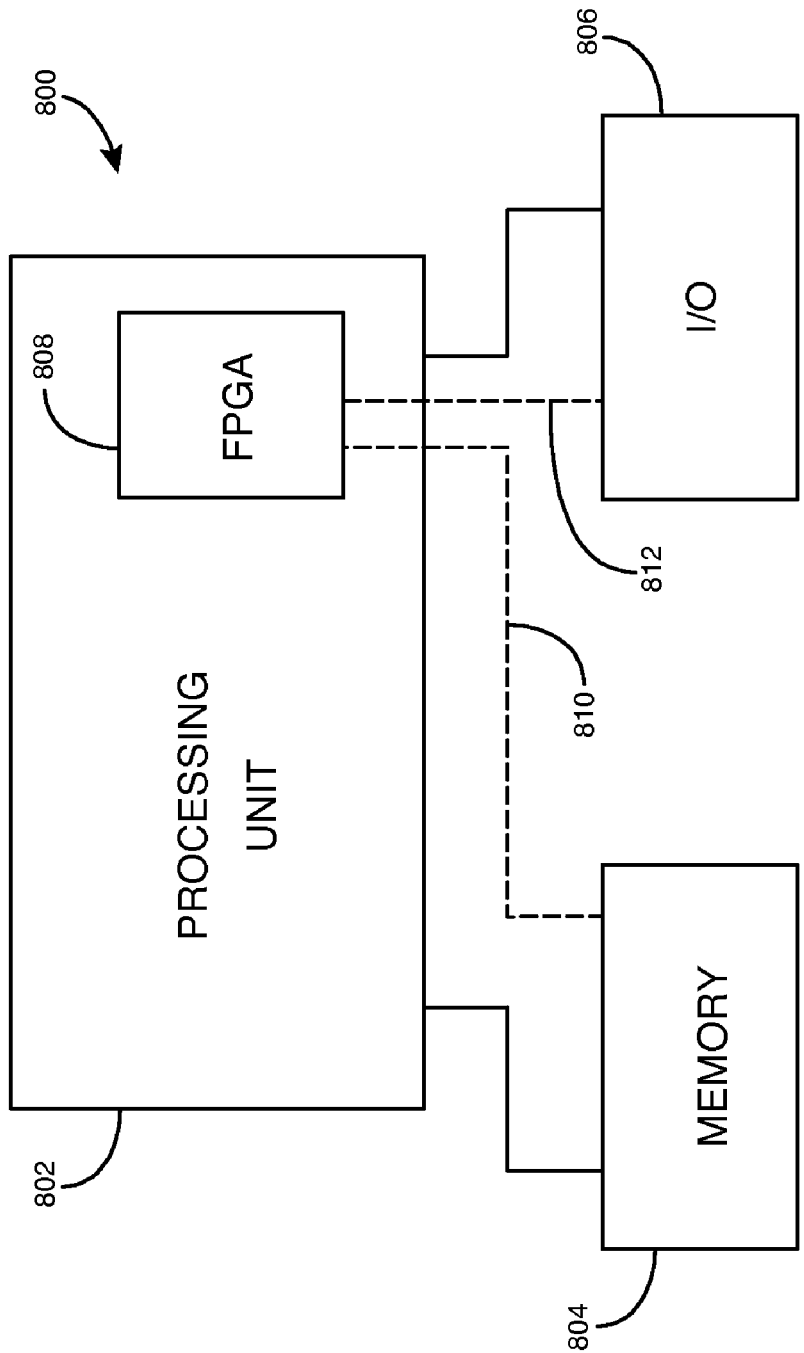
FIG. 8 shows a block diagram of an exemplary digital system that can embody techniques of the present invention.

The present invention can also be implemented in a system that has an FPGA as one of several components. FIG. 8 shows a block diagram of an exemplary digital system 800 that can embody techniques of the present invention. System 800 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 800 can be provided on a single board, on multiple boards, or within multiple enclosures.

System 800 includes a processing unit 802, a memory unit 804, and an I/O unit 806 interconnected together by one or more buses. According to this exemplary embodiment, an FPGA 808 is embedded in processing unit 802. FPGA 808 can serve many different purposes within the system in FIG. 8. FPGA 808 can, for example, be a logical building block of processing unit 802, supporting its internal and external operations. FPGA 808 is programmed to implement the logical functions necessary to carry on its particular role in system operation. FPGA 808 can be specially coupled to memory 804 through connection 810 and to I/O unit 806 through connection 812.

Processing unit 802 can direct data to an appropriate system component for processing or storage, execute a program stored in memory 804, receive and transmit data via I/O unit 806, or other similar function. Processing unit 802 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 808 can control the logical operations of the system. As another example, FPGA 808 acts as a reconfigurable processor, which can be reprogrammed as needed to handle a particular computing task. Alternatively, FPGA 808 can itself include an embedded microprocessor. Memory unit 804 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A feedback loop circuit comprising:
   a phase detector operable to compare an input signal to a feedback signal to generate a first phase adjustment signal; and
   a charge pump circuit comprising a first switching transistor, and a level-shifter that comprises a cross-coupled pair of transistors and that is operable to shift a voltage of the first phase adjustment signal to generate a first level-shifted signal for controlling a conductive state of the first switching transistor to regulate an output voltage of the charge pump circuit, wherein the level-shifter comprises first thin-oxide field-effect transistors, wherein the first switching transistor is a second thin-oxide field-effect transistor, and wherein the charge pump circuit further comprises thick-oxide field-effect transistors that have greater oxide thicknesses than the first and the second thin-oxide field-effect transistors.

2. The feedback loop circuit defined in claim 1, wherein the cross-coupled pair of transistors is operable to generate positive feedback that causes the level-shifter to have hysteresis.

3. The feedback loop circuit defined in claim 1, wherein the phase detector is operable to generate a second phase adjustment signal, and the charge pump circuit further comprises:
   a second switching transistor coupled to the first switching transistor, wherein the level-shifter is operable to shift a voltage of the second phase adjustment signal to generate a second level-shifted signal for controlling a conductive state of the second switching transistor, and wherein the first and the second switching transistors are operable to be on concurrently for a period of time during logic state transitions of the first and the second level-shifted signals.

4. The feedback loop circuit defined in claim 1, wherein the cross-coupled pair of transistors comprises second and third transistors, and the level-shifter further comprises fourth and fifth transistors, the fourth transistor being coupled to a gate of the second transistor and a drain of the third transistor, the fifth transistor being coupled to a gate of the third transistor and a drain of the second transistor, wherein the second, the third, the fourth, and the fifth transistors are third thin-oxide field-effect transistors, and wherein the thick-oxide field-effect transistors have greater oxide thicknesses than the third thin-oxide field-effect transistors.

5. A feedback loop circuit comprising:
 a phase detector operable to compare an input signal to a feedback signal to generate a first phase adjustment signal and a second phase adjustment signal; and
 a charge pump circuit comprising a first switching transistor and a level-shifter, the level-shifter comprising a cross-coupled pair of transistors that is operable to shift a voltage of the first phase adjustment signal to generate a first level-shifted signal for controlling a conductive state of the first switching transistor to regulate an output voltage of the charge pump circuit, wherein the charge pump circuit further comprises:
 a second switching transistor coupled to the first switching transistor, wherein the cross-coupled pair of transistors is operable to shift a voltage of the second phase adjustment signal to generate a second level-shifted signal for controlling a conductive state of the second switching transistor,
 a first set of current source transistors that are coupled in parallel between a supply voltage and the first and the second switching transistors, and
 an amplifier operable to control the first set of current source transistors, wherein the first and the second switching transistors are first thin-oxide field-effect transistors, and wherein the amplifier comprises thick-oxide transistors that have greater oxide thicknesses than each of the first thin-oxide field-effect transistors.

6. The feedback loop circuit defined in claim 5, wherein the charge pump circuit further comprises:
 a third switching transistor coupled to the first switching transistor;
 a fourth switching transistor coupled to the second and the third switching transistors, and wherein the phase detector is operable to generate third and fourth phase adjustment signals to control conductive states of the third and the fourth switching transistors; and
 a second set of current source transistors that are coupled in parallel between the third and the fourth switching transistors and a low voltage.

7. The feedback loop circuit defined in claim 6, wherein the amplifier is operable to control a voltage at the gates of the first set of current source transistors in response to a first voltage between the first and the third switching transistors to reduce mismatches between a total current through the first set of current source transistors and a total current through the second set of current source transistors, wherein the first, the second, the third, and the fourth switching transistors are second thin-oxide field-effect transistors, and wherein the cross-coupled pair of transistors are third thin-oxide field-effect transistors, and wherein the thick-oxide transistors have greater oxide thicknesses than each of the second and the third thin-oxide field-effect transistors.

8. The feedback loop circuit defined in claim 1, wherein the phase detector and the charge pump circuit are part of a clock and data recovery circuit.

9. The feedback loop circuit defined in claim 1, wherein the phase detector and the charge pump circuit are part of a delay-locked loop circuit.

10. An integrated circuit comprising a feedback loop circuit, wherein the feedback loop circuit comprises:

a detector operable to compare an input signal to a feedback signal to generate first and second output signals; and
 a charge pump comprising first and second switching transistors and a level-shifter that is operable to shift a voltage of the first output signal of the detector to generate a first level-shifted signal,
 wherein the first and the second switching transistors are first thin-oxide transistors that are operable to be driven by the first level-shifted signal and the second output signal of the detector to regulate an output voltage of the charge pump, wherein the level-shifter comprises second thin-oxide transistors, and wherein the charge pump further comprises thick-oxide transistors that have greater oxide thicknesses than each of the first and the second thin-oxide transistors.

11. The integrated circuit defined in claim 10, wherein the level-shifter in the charge pump comprises a cross-coupled pair of transistors that are operable to generate positive feedback and operable to cause the level-shifter to have hysteresis.

12. The integrated circuit defined in claim 10, wherein the feedback loop circuit is a delay-locked loop circuit.

13. The integrated circuit defined in claim 11, wherein the cross-coupled pair of transistors are the second thin-oxide transistors.

14. The integrated circuit defined in claim 11, wherein the cross-coupled pair of transistors comprises third and fourth transistors, and the level-shifter further comprises fifth and sixth transistors, the fifth transistor being coupled to a gate of the third transistor and a drain of the fourth transistor, and the sixth transistor being coupled to a gate of the fourth transistor and a drain of the third transistor.

15. The integrated circuit defined in claim 10, wherein the detector is operable to generate a third output signal, wherein the charge pump further comprises a third switching transistor coupled to the first switching transistor, wherein the level-shifter is operable to shift a voltage of the third output signal of the detector to generate a second level-shifted signal for controlling a conductive state of the third switching transistor, wherein the charge pump further comprises an amplifier coupled to the first, the second, and the third switching transistors, and wherein the amplifier comprises at least a subset of the thick-oxide transistors.

16. The integrated circuit defined in claim 15, wherein the charge pump further comprises a fourth switching transistor coupled to the second and the third switching transistors, a first set of current source transistors that are coupled in parallel between a first supply voltage and the first and the third switching transistors, and a second set of current source transistors that are coupled in parallel between the second and the fourth switching transistors and a second supply voltage.

17. The integrated circuit defined in claim 10, wherein the feedback loop circuit is a clock and data recovery circuit.

18. A method for generating a periodic output signal using a feedback loop circuit, the method comprising:
 comparing an input signal to a feedback signal using a detector to generate a first output signal and a second output signal;
 level-shifting the first output signal of the detector using a cross-coupled pair of transistors to generate a first level-shifted signal and level-shifting the second output signal of the detector using the cross-coupled pair of transistors to generate a second level-shifted signal; and
 controlling a conductive state of a first switching transistor in a charge pump using the first level-shifted signal to regulate an output voltage of the charge pump and controlling a conductive state of a second switching transistor in the charge pump using the second level-shifted signal, wherein the cross-coupled pair of transistors are first thin-oxide field-effect transistors, wherein the first and the second switching transistors are second thin-oxide field-effect transistors and wherein the charge sum further comprises thick-oxide field-effect transistors that have greater oxide thicknesses than the first and the second thin-oxide field-effect transistors.

19. The method defined in claim 18, wherein the feedback loop circuit is a clock and data recovery circuit.

* * * * *